(12) United States Patent
Snitchler et al.

(10) Patent No.: US 6,906,265 B2
(45) Date of Patent: Jun. 14, 2005

(54) CABLED CONDUCTORS CONTAINING ANISOTROPIC SUPERCONDUCTING COMPOUNDS

(75) Inventors: Gregory L. Snitchler, Shrewsbury, MA (US); Jeffrey M. Seuntjens, Spencer, MA (US); William L. Barnes, Brockton, MA (US); Gilbert N. Riley, Jr., Marlborough, MA (US)

(73) Assignee: American Superconductor Corporation, Westborough, MA (US)

( * ) Notice: Subject to any disclaimer, the term of this patent is extended or adjusted under 35 U.S.C. 154(b) by 674 days.

(21) Appl. No.: 09/769,705

(22) Filed: Jan. 25, 2001

(65) Prior Publication Data

US 2001/0027166 A1 Oct. 4, 2001

Related U.S. Application Data

(62) Division of application No. 08/554,814, filed on Nov. 7, 1995, now Pat. No. 6,247,225.

(51) Int. Cl.$^7$ .............................................. H01B 12/00
(52) U.S. Cl. ..................... 174/125.1; 505/231; 505/234; 505/236; 505/884; 505/926
(58) Field of Search ....................... 174/125.1; 505/230, 505/231, 234, 236, 884, 926

(56) References Cited

U.S. PATENT DOCUMENTS

| | | | |
|---|---|---|---|
| 3,131,469 A | 5/1964 | Glaze | 29/599 |
| 3,643,001 A | * 2/1972 | Schaetti | 174/15.5 |
| 3,657,466 A | 4/1972 | Woolcock et al. | 29/599 |
| 4,078,299 A | 3/1978 | Furuto et al. | 29/599 |
| 4,169,964 A | * 10/1979 | Horvath et al. | 174/15.5 |
| 4,195,199 A | 3/1980 | Hillmann et al. | 29/599 |
| 4,327,244 A | 4/1982 | Horvath et al. | 29/599 |
| 4,329,539 A | 5/1982 | Tanaka et al. | |
| 4,336,420 A | * 6/1982 | Benz | 174/125.1 |
| 4,529,837 A | 7/1985 | Borden | 29/599 |

(Continued)

FOREIGN PATENT DOCUMENTS

| | | |
|---|---|---|
| EP | 0 503 525 | 3/1992 |
| EP | 0 638 942 | 8/1994 |
| EP | 0 638 942 A1 | 2/1995 |

*Primary Examiner*—David A. Zarneke
*Assistant Examiner*—José H. Alcala
(74) *Attorney, Agent, or Firm*—Fish & Richardson P.C.

(57) ABSTRACT

A cabled conductor comprises a plurality of transposed strands each comprising one or more preferably twisted filaments preferably surrounded or supported by a matrix material and comprising textured anisotropic superconducting compounds which have crystallographic grain alignment that is substantially unidirectional and independent of the rotational orientation of the strands and filaments in the cabled conductors. The cabled conductor is made by forming a plurality of suitable composite strands, forming a cabled intermediate from the strands by transposing them about the longitudinal axis of the conductor at a preselected strand lay pitch, and, texturing the strands in one or more steps including at least one step involving application of a texturing process with a primary component directed orthogonal to the widest longitudinal cross-section of the cabled intermediate, at least one such orthogonal texturing step occurring subsequent to said strand transposition step. In a preferred embodiment, the filament cross-section, filament twist pitch, and strand lay pitch are cooperatively selected to provide a filament transposition area which is always at least ten times the preferred direction area of a typical grain of the desired anisotropic superconducting compound. For materials requiring biaxial texture, the texturing step preferably includes application of a texturing process with a second primary component in a predetermined direction in the plane of the widest longitudinal cross-section of the conductor.

34 Claims, 4 Drawing Sheets

U.S. PATENT DOCUMENTS

| | | | |
|---|---|---|---|
| 4,611,390 A | 9/1986 | Tanaka et al. | 29/599 |
| 4,652,697 A | 3/1987 | Ando et al. | 29/599 |
| 4,791,241 A * | 12/1988 | Ando et al. | 174/125.1 |
| 4,826,808 A | 5/1989 | Yurek et al. | 505/124 |
| 4,990,492 A | 2/1991 | Creedon et al. | 29/599 |
| 5,189,009 A | 2/1993 | Yurek et al. | 505/124 |
| 5,200,577 A | 4/1993 | Shimada | 174/125.1 |
| 5,364,709 A | 11/1994 | Yu | 299/599 |
| 5,387,891 A * | 2/1995 | Nick | 335/216 |
| 5,635,456 A | 6/1997 | Riley, Jr. et al. | 505/501 |
| 5,661,114 A | 8/1997 | Otto et al. | 505/501 |
| 5,885,938 A * | 3/1999 | Otto et al. | 505/431 |
| 6,038,462 A | 3/2000 | Snitchler et al. | 505/231 |
| 6,247,225 B1 * | 6/2001 | Snitchler et al. | 29/599 |
| 6,256,521 B1 * | 7/2001 | Lee et al. | 505/230 |
| 6,271,475 B1 * | 8/2001 | Otto et al. | 174/125.1 |
| 6,284,979 B1 * | 9/2001 | Malozemoff et al. | 174/125.1 |
| 6,498,302 B2 * | 12/2002 | Kaneko | 174/125.1 |

* cited by examiner

CABLED CONDUCTORS CONTAINING ANISOTROPIC SUPERCONDUCTING COMPOUNDS Under 35 USC §120 this application is a divisional application of U.S. Ser. No. 08/554,814, filed Nov. 7, 1995 now U.S. Pat. No. 6,247,225.

BACKGROUND OF THE INVENTION

1. Field of the Invention

This invention relates to superconducting cabled conductors and to a method for manufacturing them.

2. Background of the Invention

The possibility of using superconductors to obtain greater efficiency in electrical and magnetic applications has attracted considerable interest, particularly since the discovery of superconducting materials, such as the oxide superconductors, whose structures allow them to carry significant currents at relatively high temperatures, above about 20 Kelvin. However, to be practical outside the laboratory, most electrical and magnetic applications require flexible cabled lengths of conductor manufacturable with high packing factors at reasonable cost, in addition to high engineering current-carrying capacity.

High packing factor forms maximize performance per unit volume. Space constraints and the need to handle higher overall current densities are among the major design issues considered in most electrical applications.

Conductors which are flexibly cabled, that is, composed of twisted, helically wound, braided or otherwise transposed bundles of mechanically and electrically isolated conductor strands, are desired in many applications, including coils, rotating machinery and long length cables. In comparison to monolithic conductors of comparable composition and cross-section, cabled forms which are made from a number of conductor strands which are substantially mechanically isolated will have much higher flexibility. By substantially mechanically isolated is meant that the cable strands have some ability to move independently within the cable, although a degree of mechanical locking of the strands is usually desired for stability and robustness. Flexibility increases in proportion to the ratio between the cable cross-section and the strand cross-section.

In low temperature metallic superconducting conductors, cables which are made from a number of substantially electrically isolated and transposed conductor strands have been shown to have greatly reduced AC losses in comparison to monolithic conductors cf "*Superconducting Magnets*" by Martin Wilson (1983,1990), pp 197, 307–309, and it has been proposed that the same relation will hold for high temperature superconductors with more complex structures. AC losses are believed to decrease in relation to strand cross-section, cable cross-section and twist pitch. Litz cable, a cable with multiple electrically insulated strands assembled in a fully transposed configuration, is required for nearly all AC applications. For DC applications, multiple uninsulated strands may be cabled to obtain flexibility or mechanical robustness. The greater the number of strands in the cable, the more pronounced these advantages will be. Cabling is also desirable for ease in manufacturing, since cabling processes scale more easily than monolithic manufacturing processes.

However, most of the superconductors, such as superconducting ceramics of the oxide, sulfide, selenide, telluride, nitride, boron carbide or oxycarbonate types, which have shown promise for electrical and magnetic applications at relatively high temperatures are anisotropic superconducting compounds which require texturing in order to optimize their current-carrying capacity. It has not been considered feasible to form these into high packing factor, tightly transposed cable configurations because of the physical limitations of these materials. They typically have complex, brittle, granular structures which cannot by themselves be drawn into wires or similar forms using conventional metal-processing methods and do not possess the necessary mechanical properties to withstand cabling in continuous long lengths. Consequently, the more useful forms of high temperature superconducting conductors usually are composite structures in which the anisotropic superconducting compound is supported by a matrix material which adds mechanical robustness to the composite. For example, in preferred manufacturing processes for superconducting oxide composites, such as the well-known powder-in-tube (PIT) process or various coated conductor processes, the desired superconducting oxide is formed within or on a supporting matrix, typically a noble metal, by a combination of phase transformation and oxidation reactions which occur during the manufacturing process.

Even in composite forms, the geometries in which high-performance superconducting articles may be successfully fabricated from these materials are constrained by the necessity of "texturing" the superconducting ceramic to achieve adequate critical current density and by the electrical anisotropy characteristic of the superconductor. The current-carrying capacity of any composite containing one of these materials depends significantly on the degree of crystallographic alignment, known as "texturing", and intergrain bonding of the superconductor grains, induced during the composite manufacturing operation. For example, the rare earth family of oxide superconductors, among the most promising and widely studied of the ceramic superconductors, require biaxial texture, a specific crystallographic alignment along two axes of each grain, to provide adequate current carrying performance Certain ceramic superconductors with micaceous crystal structures, such as the two-layer and thee-layer phases of the bismuth-strontium-calcium-copper-oxide family of superconductors ($Bi_2Sr_2Ca_1Cu_2O_x$, also known as BSCCO 2212, and $Bi_2Sr_2Ca_2Cu_3O_x$, also known as BSCCO 2223), demonstrate high current-carrying capacity when uniaxially textured in the plane perpendicular to the current carrying direction. (Micaceous structures are characterized by highly anisotropic, plate-like grains with well-defined slip planes and cleavage systems.) In addition, many superconducting compounds may be partially textured by uniaxial texturing techniques. Those anisotropic superconducting compounds which are suitable for uniaxial texturing techniques have been considered especially promising for electrical applications because they can be textured by methods which are readily scalable to long length manufacturing.

In contrast to other known conductors, such as the normal and superconducting metals, the current carrying capacity of well-textured anisotropic superconducting composite articles will depend in large part on the relative orientations of their preferred direction, which is determined by the crystallographic alignment of their superconducting grains, and any current flow or external magnetic field. Because of their crystal structure, supercurrent flows preferentially in at least one of the directions lying within the plane normal to the c axis of each grain. Their critical current may be as much as an order of magnitude lower in their "bad" direction than in their "good" direction. Thus, an important consideration in fabricating high performance cables from these materials, which is not an issue in conventional cable fabrication, is finding a way to maximize the portions of the cable which do have the desired orientations. For optimum current-carrying capacity, it would be desirable to align all of the grains in the cable in parallel to one another along their relevant axes, e.g., at least the c axis for the uniaxial texturing typical of BSCCO 2212 or 2223, or at least the c axis and either the a axis or the b axis for the biaxial texture typical of the rare earth superconducting oxides, with each c-axis preferably perpendicular to the longitudinal axis of the cable regardless of the relative rotational orientations of the cable strands and filaments which contain them, but the twisting and bending characteristic required for conventional cabling are not readily adaptable to such uniform grain alignment.

Thus, an object of this invention is to provide a textured cabled conductor containing a textured anisotropic superconducting compound having substantial crystallographic grain alignment which is directionally independent of the rotational orientations of the strands and filaments in the cabled conductor, and a process for manufacturing such a cabled conductor.

Another object of the invention is to provide a novel cabled conductor manufacturing process that will allow strands of superconducting compounds which require texturing to be used with conventional high-speed cabling equipment.

Another object is to provide a mechanically stable, fully transposed high packing factor cabled conductor containing anisotropic superconducting compounds in a plurality of strands which may be highly aspected, and a method for manufacturing such a cabled conductor.

Another object of the invention is to provide a high packing factor, well-textured cabled conductor comprising a plurality of strands each comprising a micaceous or semi-micaceous superconducting oxide, most preferably BSCCO 2223 and a method for manufacturing such a cabled conductor.

SUMMARY OF THE INVENTION

In one aspect, the invention provides a cabled conductor comprising a plurality of transposed strands each comprising one or more preferably twisted filaments preferably surrounded or supported by a matrix material and comprising textured anisotropic superconducting compounds which have substantial crystallographic grain alignment that is substantially unidirectional and directionally independent of the rotational orientation of the strands and filaments in the cabled conductor.

In another aspect, the invention provides a transposed cabled conductor comprising grains of anisotropic superconducting compounds textured such that the crystallographic c axis alignment of each grain of the superconducting compound is substantially perpendicular to the longitudinal axis of the cabled conductor independent of the rotational orientation of the strands and filaments in the cabled conductor. The filaments are preferably surrounded or supported by a matrix material.

The invention may be practiced with any anisotropic superconducting compound which requires texturing of its grains. The compounds are preferably superconducting ceramics of the oxide, sulfide, selenide, telluride, nitride, boron carbide or oxycarbonate types, and most preferably superconducting oxides. By "grains" are meant polycrystalline colonies in which the c axes are substantially coincident and the a and b axes have a multiplicity of orientations for colony-forming superconducting compounds, such as the micaceous superconducting oxides, and single or polycrystalline regions in which the a, b, and c axes are substantially coincident for those compounds which do not form colonies.

In another aspect, the invention provides method for manufacturing a superconducting cabled conductor comprising the steps of, first, forming a plurality of composite strands, each strand comprising at least one, preferably twisted, filament having a preselected filament cross-section and twist pitch, preferably surrounded or supported by a matrix material, and containing grains of a desired anisotropic superconducting compound or its precursors; second, forming a cabled intermediate from the strands by transposing them about the longitudinal axis of the conductor at a preselected strand lay pitch, and, texturing the strands in one or more steps including at least one step involving application of a texturing process with a primary component directed orthogonal to the widest longitudinal cross-section of the cabled intermediate, and if a precursor to the desired superconducting compound remains, at least one thermomechanical processing step at conditions sufficient to produce phase transformation in the filament material, at least one such orthogonal texturing step occurring subsequent to said strand transposition step; thereby forming a superconducting cabled conductor having a crystallographic grain alignment substantially independent of the rotational orientation of the strands and filaments in the cabled conductor. In a preferred embodiment, the filament cross-section, filament twist pitch, and strand lay pitch are cooperatively selected to provide a filament transposition area which is always at least ten times the preferred direction area of a typical grain of the desired anisotropic superconducting compound. For materials requiring biaxial texture, the texturing step preferably includes application of a texturing process with a primary component in a predetermined direction in the plane of the widest longitudinal cross-section of the conductor.

In a preferred embodiment of the invention, the invention is practiced with superconducting ceramics which are themselves micaceous or semi-micaceous, or which have micaceous or semi-micaceous precursors, and the texturing step preferably includes non-axisymmetric deformation texturing with a primary component of the force tensor directed orthogonal to the widest longitudinal cross-section of the cabled intermediate. By "micaceous" is meant characterized by highly anisotropic preferred cleavage planes and slip systems, and therefore highly anisotropic current-carrying capacity. By "semi-micaceous" is meant characterized by a highly anisotropic grain structure but poorly defined cleavage planes and slip systems. By "precursor" is meant any material that can be converted to a desired anisotropic superconductor upon application of a suitable heat treatment. If the desired anisotropic superconductor is an oxide superconductor, for example, precursors may include any combination of elements, metal salts, oxides, suboxides, oxide superconductors which are intermediate to the desired oxide superconductor, or other compounds which, when reacted in the presence of oxygen in the stability field of a desired oxide superconductor, produces that superconductor.

In a preferred embodiment, the desired superconducting compound is surrounded or supported by a matrix, preferably a metal. By "matrix" as that term is used herein, is meant a material or homogeneous mixture of materials which supports or binds a substance, specifically including the superconducting compounds or their precursors, disposed within or around the matrix. Silver and other noble metals are the preferred matrix materials, but alloys substantially comprising noble metals, including ODS silver, may be used.

In a preferred embodiment, each strand may be coated with a layer of an insulating material prior to cabling so that the strands in the finished cable will be electrically discrete. By "insulating material", as that term is used herein, is meant a material with an electrical resistivity high in comparison to that of the matrix material used in the composite under the intended conditions of use.

In the most preferred embodiment of the invention, the desired anisotropic superconducting compounds are members of the bismuth family of superconducting oxides, and the orthogonal texturing step preferably includes non-axisymmetric deformation texturing with a primary component of the force tensor directed orthogonal to the widest longitudinal cross-section of the cabled intermediate. In addition, because members of the bismuth family tend to selectively form grains aligned with the filament walls, at least one additional requirement is included in the process to overcome this tendency. In one embodiment of the invention, this requirement is that the filament cross-section, filament twist pitch, and strand lay pitch be cooperatively selected so that at each point on the filament, regardless of how it is twisted, the filament width in the plane of the widest longitudinal cross-section of the conductor which is always greater than, and preferably twice as large as the filament height orthogonal to the widest longitudinal cross-section of the conductor. In another embodiment of the invention, this additional requirement is a magnetic alignment step with a primary component of the field directed orthogonal to the widest longitudinal cross-section of the cabled intermediate. The magnetic alignment step may be done anytime after cabling. In a preferred embodiment, one or more heat treatment steps at conditions chosen to provide crack healing in the filaments but not to melt the matrix material may be incorporated into the process to increase the overall strain tolerance and performance of the cabled conductor.

By "low aspect ratio" is meant an aspect ratio less than about 2:1, and by "high aspect ratio" is meant an aspect ratio greater than or equal to about 3:1 and preferably about 5:1.

DETAILED DESCRIPTION OF THE PREFERRED EMBODIMENTS

Figure 1:
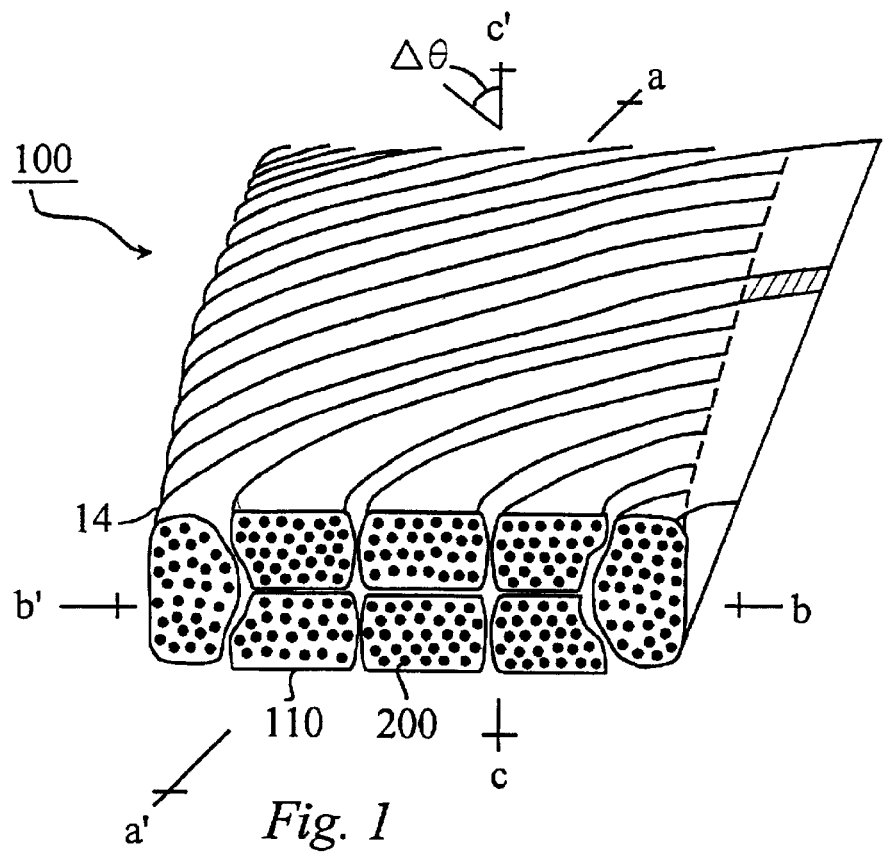
FIG. 1 is a perspective view showing a superconducting cabled conductor, 100 in accordance with one aspect of the invention.

Referring now to FIG. 1 of the drawings, a superconducting cabled conductor 100 manufactured in accordance with one embodiment of the invention, is shown in cutaway perspective view. In FIG. 1, line a–a' defines the longitudinal axis of the conductor, line b–b' defines the major axis of its vertical cross-section, and line c–c' defines the minor axis of its vertical cross-section. Line c–c' is orthogonal to the preferred current direction for the conductor, which flows in the a–b plane. Lines a–a' and b–b' together define the widest longitudinal cross-section 14 of the conductor. The cabled conductor 100 comprises a plurality of strands 110 transposed about the longitudinal axis of the conductor.

Figure 2:
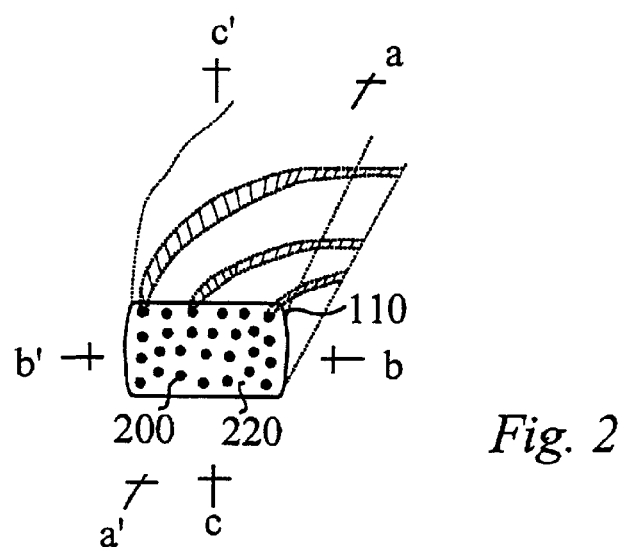
FIG. 2 is an expanded cross-section of the composite strand 120 shown in FIG. 1.
Figure 3:
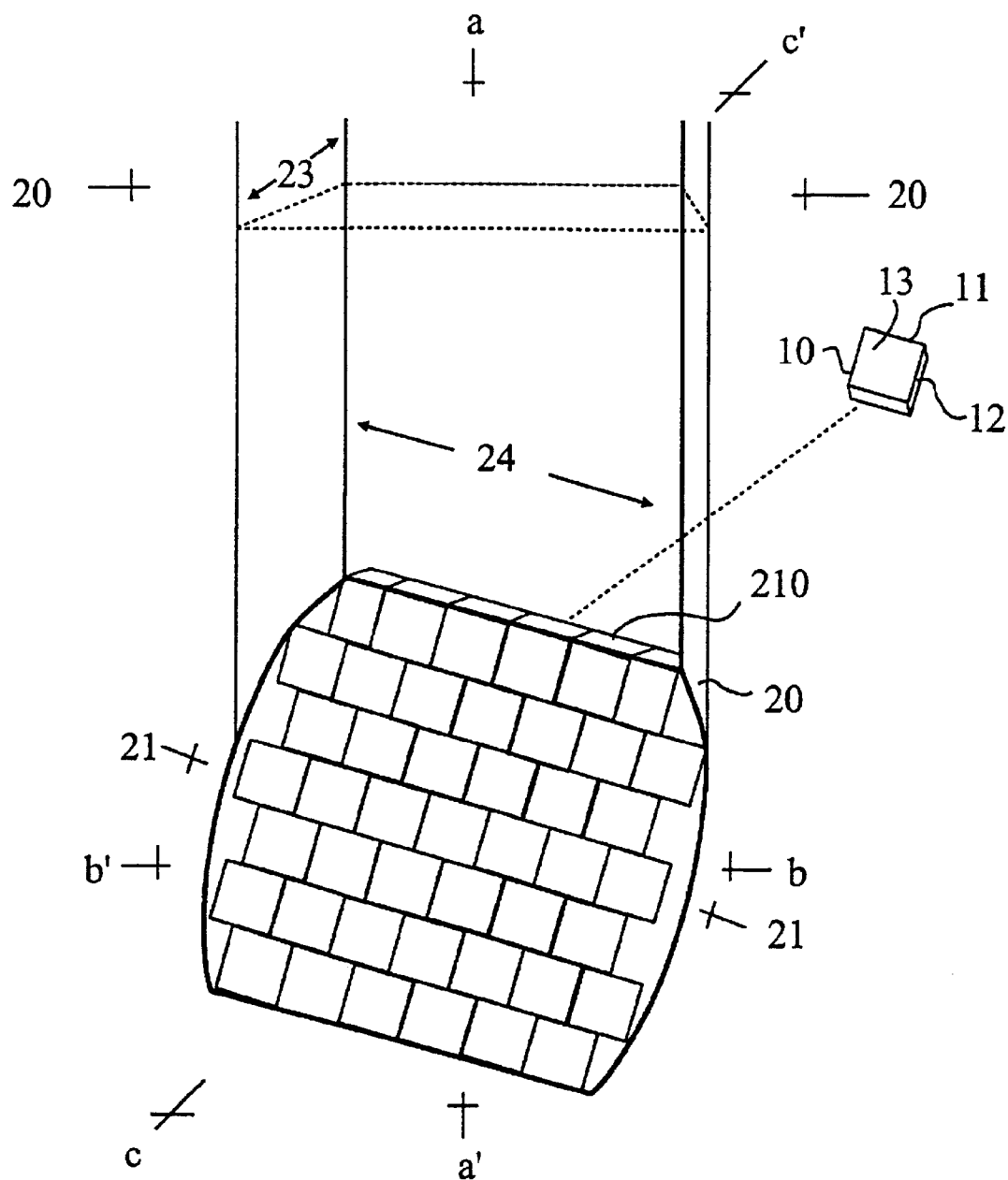
FIG. 3 is an expanded cross-section of the filament 200 shown in FIGS. 1 and 2.
Figure 4:
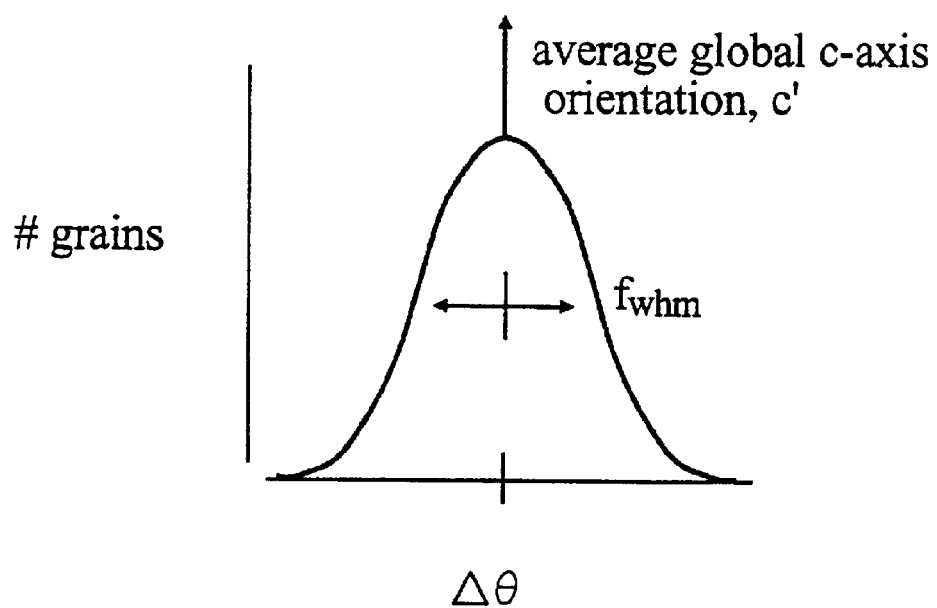
FIG. 4 is a chart of a mosaic spread typical of a well-textured anisotropic superconducting compound.

In FIG. 2, a strand 110 is shown in expanded cross-section. Each strand comprises one or more substantially continuous filaments 200 comprising grains of a desired anisotropic superconducting compound. For AC applications, it is preferred that the filaments be twisted. In the preferred embodiment shown, each filament 200 is supported or surrounded in a matrix material 220. Referring now to FIG. 3, each grain 210 of the desired anisotropic superconducting compound has a length 10, a width 11 and a thickness 12, with the length and width being roughly the same order of magnitude. Typically, the preferred direction of superconducting current flow is perpendicular to the thickness of the grain. Thus, the preferred direction area 13 of the grain 210 is the product of its length 10 and its width 11. For the micaceous and semi-micaceous compounds which are preferred for the operation of this invention, the grain thickness 12 will typically be substantially less than either the length 10 or width 11. For optimal current flow, it is desirable that the grains 210 have substantially unidirectional crystallographic alignment with their thicknesses 12 substantially uniformly oriented in a single direction orthogonal to the widest longitudinal cross-section of the cable. This direction, shown in FIG. 2 as c–c', is typically known as the crystallographic c direction. By "substantially unidirectional crystallographic alignment" is meant that the overall distribution of grain thickness orientations forms a normal distribution, known as a "mosaic spread", such as that illustrated in FIG. 4, with respect to the desired axis and the distribution has a full width, half max value ($f_{whm}$) less than a predetermined value, typically on the order of 10–20 degrees for superconducting oxides. This distribution of grain orientations has, however, not generally been obtainable in tightly transposed superconducting conductors known in the art. As shown in FIG. 3 and in accordance with the invention, the grains 210 in the cabled conductor of the present invention have been textured to have substantially unidirectional crystallographic grain alignment that is substantially independent of the rotational orientation of the strands 120 and filaments 200 in the cabled conductor 100.

Returning to FIG. 3, each filament 200 has a substantially uniform filament cross-sectional area 20 in the plane transverse to the longitudinal axis of the filament. At each point along its longitudinal axis, each filament 200 will have a height 23 which is its smallest dimension in a direction parallel to the c–c' axis and a width 24 which is its smallest dimension in a direction perpendicular to the c–c' axis, which will be discussed in connection with embodiments using the bismuth family of superconducting oxides. At each point along its longitudinal axis, each filament 200 also has a transposition area 21 which is the cross-sectional area of the filament at that point in a plane perpendicular to the crystallographic c direction, that is, parallel to the desired texturing direction. The transposition area 21 varies with the rotational orientation of the filament 200 and strand 120 relative to the desired texturing direction, being smallest at the cross-over points where the filament wraps in a direction perpendicular to the desired texturing direction. It is never less than the filament cross-sectional area 20, and may be made greater than 20 even at the perpendicular cross-over points depending on the relative strand and filament dimensions, strand lay pitch and filament twist pitch selected. In accordance with a preferred embodiment of the invention, the transposition area is selected to be at least ten times, and preferably at least thirty times, the preferred direction area of a typical superconducting grain to permit crystallographic grain alignment in the desired direction at the filament cross-over points. If the transposition area is too small at any region in the filament, a high transport supercurrent is not assured regardless of the texturing method selected.

The strands may include any desired anisotropic superconducting compound which requires texturing and may be at least partially textured by the application of a uniaxial texturing orthogonal. For example, superconducting ceramics of the oxide, sulfide, selenide, telluride, nitride, boron carbide or oxycarbonate types may be used. Superconducting oxides are preferred. For example, members of the rare earth (RBCO) family of oxide superconductors; the bismuth (BSCCO) family of oxide superconductors, the thallium (TBSCCO) family of oxide superconductors; or the mercury (HBSCCO) family of oxide superconductors may be used. The bismuth and rare earth families of oxide superconductors are most preferred for operation of the invention. Thallination, the addition of doping materials, including but not limited to lead and bismuth, variations from ideal stoichiometric proportions and such other variations in the formulation of the desired superconducting oxides as are well known in the art, are also within the scope and spirit of the invention. The two-layer and three-layer phases of the bismuth-strontium-calcium-copper-oxide family of superconductors ($Bi_2Sr_2Ca_1Cu_2O_x$, also known as BSCCO 2212 and $Bi_2Sr_2Ca_2Cu_3O_x$, also known as BSCCO 2223, respectively) are the superconducting oxides most preferred for the operation of the present invention.

By "matrix" as that term is used herein, is meant a material or homogeneous mixture of materials which supports or binds a substance, specifically including the superconducting oxides or their precursors, disposed within or around the matrix. Metals are typically used. Silver and other noble metals are the preferred matrix materials, but alloys substantially comprising noble metals, including ODS silver, may be used. "Alloy" is used herein to mean an intimate mixture of substantially metallic phases or a solid solution of two or more elements. By "noble metal", as that term is used herein, is meant a metal which is substantially non-reactive with respect to oxide superconductors and precursors and to oxygen under the expected conditions (temperature, pressure, atmosphere) of manufacture and use. Preferred noble metals include silver (Ag), gold (Au), platinum (Pt) and palladium (Pd). Silver and its alloys, being lowest in cost of these materials, are most preferred for large-scale manufacturing.

In the embodiments preferred for AC applications, each strand is surrounded with a layer of an insulating material. Because superconducting composites can carry large currents at very low voltages, insulating materials with a broad range of electrical properties may be used. Elemental oxides, sulfides, and nitrides, semiconductors, glasses, and intermetallics are all suitable to provide the insulating layers in the present invention. For AC applications it is preferred that each strand be coated with at least 2 microns thickness of a suitable material during processing but in the fully processed article, the thickness of the insulating material may be considerably lower. Preferred insulating materials include magnesium oxide, tin oxide, boron nitride and silicon carbide. Materials which are converted to insulating materials under the conditions for processing the conductor may also be used.

Generally, a cabled conductor such as the one illustrated with a crystallographic grain alignment substantially independent of the rotational orientation of the strands and filaments in the cabled conductor, may be manufactured in accordance with the invention by the steps of: first, forming a plurality of composite strands, each strand comprising at least one, preferably twisted, filament having a preselected filament cross-section and twist pitch, preferably surrounded or supported by a matrix material, and containing grains of a desired anisotropic superconducting compound or its precursors; second, forming a cabled intermediate from the strands by transposing them about the longitudinal axis of the conductor at a preselected strand lay pitch, and, texturing the strands in one or more steps including at least one step involving application of a texturing process with a primary component directed orthogonal to the widest longitudinal cross-section of the cabled intermediate, at least one such orthogonal texturing step occurring subsequent to said strand transposition step. If a precursor to the desired superconducting compound remains, at least one thermomechanical processing step at conditions sufficient to produce phase transformation in the filament material is among in the texturing steps. For materials requiring biaxial texture, such as members of the yttrium and thallium families of oxide superconductors, the texturing step preferably includes application of a texturing process with a primary component in a predetermined direction in the plane of the widest longitudinal cross-section of the conductor.

The invention may be practiced with any form of composite strand, for example a multifilamentary wire, monofilamentary wire or sandwiched laminate. The stands may be prepared by any conventional method, including physical film forming methods such as sputtering or ion beam assisted deposition (IBAD), chemical film forming methods such as chemical vapor deposition (CVD), or the well-known powder-in-tube (PIT) process. In a preferred embodiment, the filament cross-section, filament twist pitch, and strand lay pitch are cooperatively selected to provide a filament transposition area which is always at least ten times the preferred direction area of a typical grain of the desired anisotropic superconducting compound at least ten times the preferred direction area of a typical grain of the desired anisotropic superconducting compound.

To minimize the strain on the strand during the cabling operation, it is preferred that low aspect ratio strands and relatively uncompacted filament material be used during the strand transposition step, but this is not necessary for the operation of the invention. Either partially aspecting the strand, partially pre texturing the filaments, or both prior to strand transposition is within the scope of the invention. Precursors may also be advantageously be used instead of the desired superconducting compounds to minimize strain damage during the cabling operation, as they typically have much higher strain tolerances. By "precursor" is meant any material that can be converted to the desired superconductor upon application of a suitable heat treatment. If an oxide superconductor is desired, for example, precursors may include any combination of elements, metal salts, oxides, suboxides, oxide superconductors which are intermediate to the desired oxide superconductor, or other compounds which, when reacted in the presence of oxygen in the stability field of a desired oxide superconductor, produces that superconductor. For example, there may be included elements, salts or oxides of copper, bismuth, strontium, and calcium, and optionally lead, for the BSCCO family of oxide superconductors, or, as an example of an intermediate, BSCCO 2212 together with non-superconducting phases which together are capable of being converted to the desired oxide superconductor, BSCCO 2223. The formation of an intermediate may be desired in order to take advantage of desirable processing properties, for example, a micaceous structure or a high strain tolerance, which may not be equally possessed by the desired superconducting oxide. For example, uncompacted BSCCO 2223 precursors typically have strain tolerances on the order of 20%, while strongly linked BSCCO 2223 has a strain tolerance on the order of less than 1%. Precursors are included in amounts sufficient to form an oxide superconductor. In some embodiments, the precursor powders may be provided in substantially stoichiometric proportion. In others, there may be a stoichiometric excess or deficiency of any precursor to accommodate the processing conditions used to form the desired superconducting composite. For this purpose, excess or deficiency of a particular precursor is defined by comparison to the ideal cation stoichiometry of the desired oxide superconductor. The addition of doping materials, including but not limited to the optional materials identified above, variations in proportions and such other variations in the precursors of the desired superconducting oxides as are well known in the art, are also within the scope and spirit of the invention.

The invention is scalable to large scale manufacturing techniques and high packing factor cable designs. Strands formed as described may be cabled at high packing factors on conventional cabling equipment such as that supplied by the Entwhistle Company of Hudson, Mass. Planetary or rigid cabling equipment may be used. A Rutherford-type cable is preferred. This is a type of generally rectangular, compacted Litz cable whose general assembly parameters are well known in the art. However, any type of cable, such as a partially transposed cable, or the Roebel or braided forms of Litz cable may be used. The strands may be fabricated in accordance with the cabling parameters generally specified for the particular piece of equipment. Typical parameters for a Rutherford cabling machine are described in connection with the bismuth embodiment discussed below.

Processing to induce the desired texture may be done in one or more steps and may include reaction methods, deformation methods, or other methods such as magnetic alignment, depending on the texturing mechanisms most suited to the desired superconducting ceramic, but must include at least one texturing step subsequent to strand transposition which involves the application of a texturing process with a primary component directed orthogonal to the widest longitudinal cross-section of the cabled intermediate, at conditions sufficient to induce at least substantial c axis alignment of the grains in the filament. The primary component may be either a component of a tensor, such as an applied strain, the gradient of a scalar, such as temperature, or the divergence of a field, such as a magnetic field. Well-known techniques which are suitable for orthogonal texturing include, for example, deformation texturing for micaceous compounds such as BSCCO 2212 and 2223, magnetic alignment for the BSCCO and YBCO families of compounds, and melt-texturing via directional solidification for the YBCO family of compounds. For example, known techniques for texturing the two-layer and three-layer phases of the bismuth-strontium calcium-copper-oxide family of superconductors (BSCCO 2212 and BSCCO 2223, respectively) are described in Tenbrink; Wilhelm, Heine and Krauth, *Development of Technical High-Tc Superconductor Wires and Tapes*, Paper MF-1, Applied Superconductivity Conference, Chicago(Aug. 23–28, 1992), and Motowidlo, Galinski, Hoehn, Jr. and Haldar, *Mechanical and Electrical Properties of BSCCO Multifilament Tape Conductors*, paper presented at Materials research Society Meeting, Apr. 12–15, 1993, and V. Chakrapani, D. Balkin, and P. McGinn, *Applied Superconductivity*, Vol. 1, No. 1/2, pages 71–80, 1993. Multistep texturing processes, in which only some of the steps meet the uniaxial orthogonal requirement, such as staged growth texturing for YBCO and TBSCCO, may also be used. A staged growth texturing technique for TBSCCO is described, for example, in co-pending U.S. Ser. No. 08/147,061 filed Nov. 3, 1993 and entitled "Preparation of HTSC Conductors by Deformation-Induced Texturing of Superconductors Without Slip Systems".

In a preferred embodiment, the desired anisotropic superconducting compound is a micaceous or semi-micaceous superconducting oxide, preferably BSCCO 2212 or 2223. Cabled conductors comprising such micaceous compounds may be most successfully fabricated by transposing the strands before full texture is developed in the strands and then texturing the cabled strands in one or more steps including mechanical deformation by a non-axisymmetric technique at conditions sufficient to achieve a high aspect ratio in the strands, and texturing in the filament material as further described below. In addition, because members of the bismuth family tend to selectively form grains aligned with the filament walls, the preferred inventive process includes one or more additional requirements intended to overcome this tendency.

In one embodiment of the invention, a a magnetic alignment step with a primary aligning force orthogonal to the widest longitudinal cross-section of the cabled intermediate may be included after cabling in addition to the deformation step in order to reorient the grains near the cross-over points in the desired direction. Recently, a magnetic alignment technique has demonstrated good texture in 2212 thick film material on Ag [H. B. Liu and J. B. Vander Sande, submitted to Physica C, (1995)] A 2212 melt-growth heat treatment performed in a homogeneous magnetic field of 2–10 T at temperatures of 820 to 840C produced texture with the orientation of the c direction of the 2212 grains parallel to the magnetic field.

In another embodiment of the invention, the filament dimensions, filament twist pitch and strand lay pitch are cooperatively selected so that the filament width in the direction orthogonal to the c–c' axis is always greater than, and preferably at least twice as great as the filament height in the direction parallel to the c–c' axis. This latter requirement can be met by selecting an aspected filament cross-section, a strand lay pitch which is not an even multiple of the filament twist pitch and avoiding pitches which tend to align the filament walls parallel the c–c' axis. Grain growth perpendicular to the desired direction will be less pronounced with this aspected, angled filament layout.

The strands may be made by any well-known method, using, for example, either oxide or metallic precursors. However, multifilamentary wires and tapes made by the PIT process are preferred. The general PIT process is described, for example, in U.S. Pat. Nos. 4,826,808, and 5,189,009 to Yurek et al. and W. Gao & J Vander Sande, *Superconducting Science and Technology*, Vol. 5, pp. 318–326, 1992, which teach the use of a metal alloy precursor having the same metal content as the desired superconducting oxide, and in C. H. Rosner, M. S. Walker, P. Haldar, and L. R. Motowido, "*Status of HTS superconductors: Progress in improving transport critical current densities in HTS Bi-2223 tapes and coils*" (presented at conference 'Critical Currents in High Tc Superconductors', Vienna, Austria, April, 1992) and K. Sandhage, G. N. Riley Jr.,. and W. L. Carter, "*Critical Issues in the OPIT Processing of High Jc BSCCO*

*Superconductors*", Journal of Metals, 43,21,19, which teach the use of either a mixture of powders of the oxide components of the superconductor or of a powder having the nominal composition of the superconductor, all of which are herein incorporated by reference. Generally speaking, the PIT process for making multifilamentary superconducting composite conductors includes the stages of forming a powder of superconductor precursor material, loading this powder into noble metal containers and deformation processing one or more filled containers by a longitudinal reduction technique to provide a composite of reduced cross-section including one or more filaments of precursor material in intimate contact with a surrounding noble metal matrix. Multifilamentary composite conductors undergo rebundling operations at one or more points during the precursor fabrication stage. This operation involves assembling filled containers in some close packed or other symmetric arrangement, possibly around a hollow or non-superconducting central supporting core, inside a metal tube, or both, followed by further longitudinal reductions. Utilizing a planetary set-up, a strand with an aspect ratio as high as 2:1 may used to make Rutherford cable. An intermediate comprising BSCCO 2223 or its precursors will, however, require post-cabling deformation to an average strand aspect ratio of 3:1 or greater to create adequate texturing for commercially acceptable current-carrying capacity.

In accordance with a preferred embodiment of the invention, the transposition area is selected to be at least ten times, and preferably at least thirty times, the preferred direction area of a typical superconducting grain to permit crystallographic grain alignment in the desired direction at the filament cross-over points.

Figure 5:
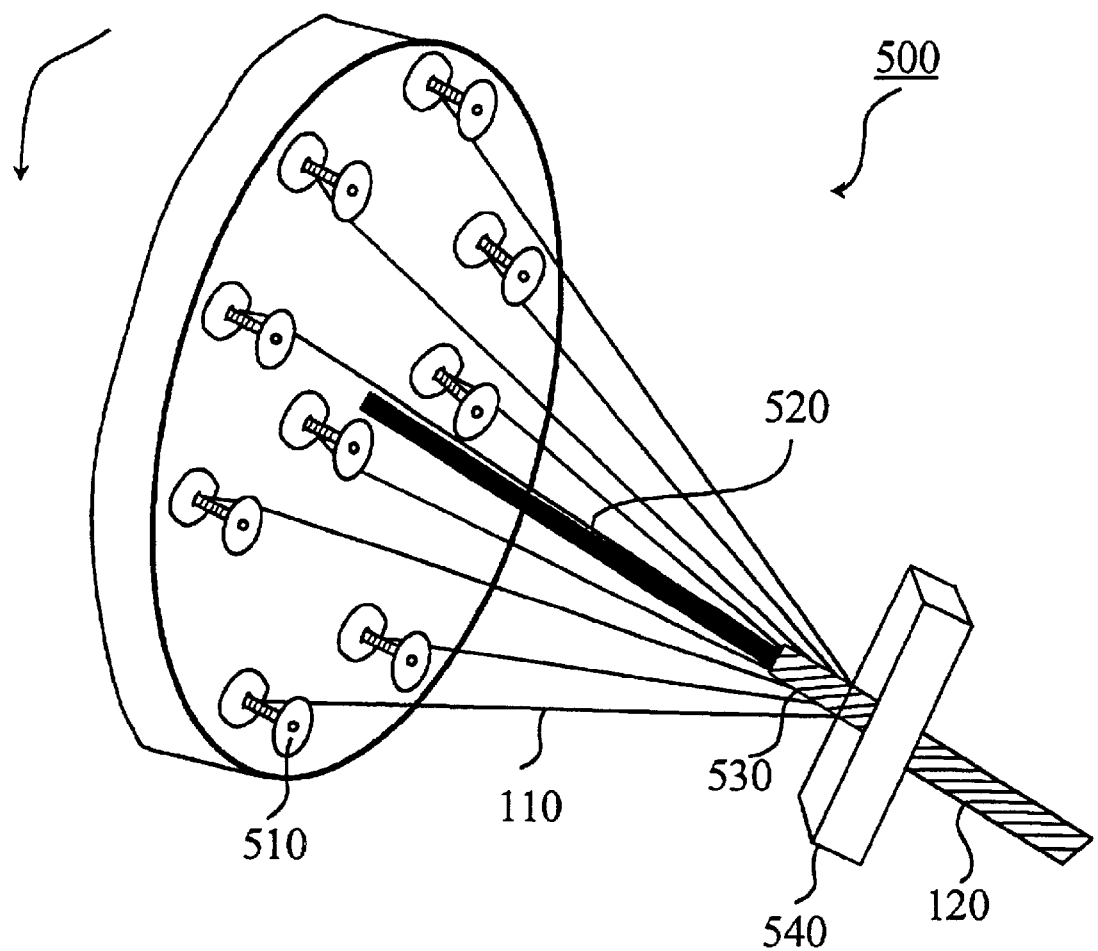
FIG. 5 is a schematic representation of a cabling machine.

In accordance with the invention, the strands 110 to be transposed are spooled in equal amounts onto N spools 510, where N is the number of strands to be included in the intermediate 120. These spools are loaded onto the cabling machine 500, shown schematically in FIG. 5. Each spool has an independent tensioning device to provide uniform tension control on pay-off. The applied strand tension is preferably less than 0.2 of the tensile strength of the strand. The spools rotate together about a common rotation axis 520. In the machine shown in FIG. 5, a planetary control provides the capability to rotate the spool through its centroid about an axis parallel to the rotation axis. In this configuration, the same side of the stand always faces the same direction in the cable. However, the invention may also be practiced on rigid cabling machines, which do not provide this capability, without adversely affecting the desired texturing of the superconducting cable.

Each of the spools pays off to a "gathering point" at a fixed position from the mandrel 530 and approximately circumferentially symmetric about the mandrel. The mandrel is a spade-shaped tooling that is non-rotating and located on the common rotation axis. The strands wrap around the mandrel and pay-off into a shaping turks-head roll 540 that defines the cable width and thickness. The rate that the cable is pulled through the turks-head relative to the rotation rate around the common axis defines the cable lay pitch. These parameters are not independent in an optimized intermediate cable, one that is robust for handling and post cabling deformation. The thickness t of the intermediate cable should typically be chosen to be not more than 1.8 times the strand diameter d, to "lock" the strands together by "upsetting" them. Locking is typically done by a slight deformation which is sufficient to change the shape of the strand from round to elliptical but not substantially change its cross-sectional area. The width w of the intermediate cable should typically be chosen to be not significantly more than the value of $N/2*d$, to provide "locking" in the width direction. The lay pitch should typically be chosen to be about $n*d*N$, where n is a constant characteristic of the cabling equipment which is typically in the range of 3 to 6, and most typically in the range of 3.7 to 5.3. Lay pitches below this range will result in excessive compaction and cabling difficulties. Cables with significantly longer lay pitches can become mechanically unstable. The strands can be pulled through the turks-head with a capstan (a rotating wheel), or by a caterpuller (between two parallel belts). Either of these may be assisted by a powered turks-head roll replacing a standard non-powered turks-head driven by a torque somewhat less than that required to pull the cable through the rolls. The intermediate cable is taken-up onto a spool under a tension preferably on the order of N* applied strand tension at the spools.

To fully texture the intermediate and form a superconducting cable, the intermediate is mechanically deformed in one or more steps by a non-axisymmetric technique, preferably at conditions sufficient to achieve a high aspect ratio and a packing factor of at least 75% and preferably at least 85%, and to texture the filament material. The post cable deformation is accomplished by rolling or additional turks-head rolling. Cold rolling or powered turks heading is preferred. It is preferred that a total strain of up to 90% be applied in 1–25 passes. Intermediate anneals may be performed to reduce strain hardening of the matrix material. Tension is typically applied on the pay-off and take-up side of either of these rolling operations. The tension controls affect the neutral point in the rolling operation and are typically chosen to be less than half of the yield strength of the composite. When powered turks-heads are used, it is possible to combine the cable fabrication with substantial deformation. This is not otherwise possible in a standard pull-through turks-head, because of the limited pull strength of the cable on the exit side. When a powered turks head is used, the exiting cable thickness can be up to 80% or less than of the 1.8*d guideline mentioned above.

Thereafter the intermediate cable is further thermomechanically processed in one or more steps in an oxidizing atmosphere at conditions sufficient to produce at least one of the effects of texturing, and, if a precursor to the desired micaceous superconducting oxide remains, phase transformation in the filament material, thereby forming a superconducting cabled conductor from the intermediate.

In the preferred embodiment, a final heat treatment is performed under conditions suitable for healing strain-induced cracks in the filament material. For most oxide superconducting composites, the critical current is independent of the amount of tensile strain placed on the composite until the strain reaches a threshold value, commonly referred to as the critical strain of the material. Above that threshold, the critical current value decreases asymptotically with increasing tensile strain due to formation of localized microcracks in the filament material. A melt-textured growth technique such as that described in Kase et al, *IEEE Trans. Mag.* 27(2), 1254(1991) may be used for crack-healing in BSCCO 2212. Suitable final heat treatment processes for BSCCO 2223 are described, for example, in copending applications U.S. Ser. No. 08/041,822 filed Apr. 1, 1993 and entitled "Improved Processing for Oxide Superconductors", U.S. Ser. No. 08/198,912, filed Feb. 17, 1994 and also entitled "Improved Processing for Oxide Superconductors", and in U.S. Ser. No. 08/553,184, filed of even date herewith and entitled "Processing of Oxide Superconducting Cables". If the local tensile strain is much greater than the critical strain value, micro-crack formation can occur to such an extent that healing during thermomechanical processing becomes impossible. Thus, it is preferred that the maximum strand bend radius formed in the intermediate be less than about 8%.

The invention provides a cabled conductor comprising a plurality of transposed strands each comprising one or more preferably twisted filaments comprising textured anisotropic superconducting compounds which have substantial crystallographic grain alignment that is directionally independent of the rotational orientation of the strands and filaments in the cabled conductor. The anisotropic superconducting compounds are textured such that the crystallographic c axis grain alignment of each grain of the superconducting compound is substantially unidirectional and perpendicular to the longitudinal axis, and preferably to the widest longitudinal cross-section, of the cabled conductor independent of the rotational orientation of the strands and filaments in the cabled conductor.

Because the low density powder which is included in the strands at the time they are transposed has a much higher strain tolerance than the compressed and textured superconducting ceramic material, the cracking characteristic of most superconducting ceramics is reduced and cables with packing factors in excess of 75% may be manufactured in accordance with the invention.

The invention may be further understood from the following examples:

EXAMPLE 1

A 91 filament composite was made by the PIT process with an approximately a hexagonal array filament pattern using standard monofilament 2223 precursor in a fine Ag sheath. Precursor powders were prepared from the solid state reaction of freeze-dried precursors of the appropriate metal nitrates having the nominal composition of 1.8:0.3:1.9:2.0:3.1 (Bi:Pb:Sr:Ca:Cu)?]. $Bi_2O_3$, $CaCO_3$, $SrCO_3$, $Pb_3O_4$-, and CuO powders could equally be used. After thoroughly mixing the powders in the appropriate ratio, a multistep treatment (typically 3–4 steps) of calcination (800° C.±10° C., for a total of 15 h) and intermediate grinding was performed in order to remove residual carbon, homogenize the material and generate a BSCCO 2212 oxide superconductor phase. The powders were packed into silver sheaths to form a billet. The billets were extruded to a diameter of about ½ inch (1.27 cm) and annealed at 450 C for 1 hour. The billet diameter was narrowed with multiple die steps, with a final step drawn through a hexagonally shaped die into a silver/precursor hexagonal monofilament wires.

Eighty-nine wires 0.049×0.090", one 0.1318 round and one 0.055 round wires were assembled and inserted into a 0.840" outer diameter by 0.740" inner diameter silver tube to form a bundle. The assembly was baked for four hours at 450 degrees the bundle was allowed to cool and then drawn through to 0.072 via successive 20% and 10% pass reductions to for a multi-filamentary round strand. At 0.072" it was annealed at 450 degrees for one hour, allowed to cool and drawn to 0.354" It was again annealed at 450 degrees C. for one hour, allowed to cool and then drawn to 0.245" diameter. The composite was annealed in air at 300C for nominally 10 minutes. The material was divided approximately equally into 8 parts and each was layer wound onto a cabling spool.

An 8 strand Rutherford cable was made from 91 filament composite strand. A rigid cabling configuration was used, where the spools' orientation are fixed relative to the rotating support that holds them. The tension on each strand was controlled by magnetic breaks and set to nominally 0.5 inch-pounds. The width and thickness of the cable were set by a non-powered turks-head to be 0.096 and 0.048 inch, respectively. The cable lay pitch was set by a capstan take-up speed relative to the rotations speed to be nominally 1.03 inch. After cabling, the material was heat treated at 760 C for 2 hr. in 0.1 atm of oxygen. The cable was then rolled to at thickness of 0.0157 inch and heat treated for 6 hr. at 827 C in 7.5% oxygen in nitrogen atmosphere. The cable was finally turks head rolled to 0.0126 inch in thickness. A final heat treatment of 40 hr. at 827 C, 30 hr. at 808 C, and 30 hr. at 748 C, all in 0.075 atm of oxygen in nitrogen was employed. The Je at 77K (B=0) was 2996 $A/cm^2$ at a fill factor of nominally 25% superconductor cross section. The voltage/current characteristics of the sample in 0 magnetic field are shown in Exhibit 1.

EXAMPLE 2

A 91 filament composite was made with an approximately a hexagonal array filament pattern as described in Example 1 above. In this example, the multifilament composite was further drawn to nominally 0.028 inch diameter and turk-headed or drawn through a square die to 0.0245 inch on a side. The square cross section composite was annealed in air at 300C for nominally 10 minutes. The material was divided approximately equally into 8 parts and each was layer wound onto a cabling spool.

An 8 strand Rutherford cable is made from 91 filament composite strand. A "ferris wheel" cabling configuration is used, where the spools' orientation in space is fixed as it rotates around the axis of the cabler, similar to a seat on a ferris wheel. The tension on each strand is controlled by magnetic breaks and set to nominally 0.5 inch-pounds. The width and thickness of the cable were set by a non-powered turks-head to be 0.096 and 0.048 inch, respectively. The strands enter the turks-head with the sides of the square cross section maintained parallel to the sides of the resulting rectangular cable. The cable lay pitch is set by a capstan take-up speed relative to the rotations speed to be nominally 1.03 inch. After cabling, the material is heat treated at 760 C for 2 hr. in 0.1 atm of oxygen. The cable is then rolled to at thickness of 0.0157 inch in a single pass. The cable is then heat treated for 6 hr. at 827 C in 7.5% oxygen in nitrogen atmosphere. The cable is finally rolled to 0.0145 inch in thickness in a single pass. A final heat treatment of 40 hr. at 827 C, 30 hr. at 808 C, and 30 hr. at 748 C, all in 0.075 atm of oxygen in nitrogen is employed. The Je at 77K =0) is 2280 $A/cm^2$ at a fill factor of nominally 20% superconductor cross section.

The various features and advantages of the invention may be seen from the foregoing description and examples. Iterative variations on the processes described above, such as changes in the materials, the number and type of texturing steps, and the cabling styles and equipment used will be seen to be within the scope of the invention. Many modifications and variations in the preferred embodiments illustrated will undoubtedly occur to those versed in the art, as will various other features and advantages not specifically enumerated, all of which may be achieved without departing from the spirit and scope of the invention as defined by the following claims.

What is claimed is:

1. A cabled conductor comprising a plurality of transposed strands each comprising one or more filaments comprising grains of textured anisotropic superconducting compounds which have crystallographic grain alignment that is substantially unidirectional and directionally independent of the rotational orientation of the strands and filaments in the cabled conductor.

2. A cabled conductor according to claim 1 wherein each strand has a preselected strand lay pitch and each filament has a preselected filament cross-section and filament twist pitch, and the strand lay pitch, filament cross-section and filament twist pitch being cooperatively selected to provide a filament transposition area permitting the crystallographic grain alignment in the grain direction at the filament cross-over points.

3. A cabled conductor according to claim 1, wherein each strand has a strand lay pitch and each filament has a filament cross-section and filament twist pitch, and the filament cross-section, filament twist pitch, and strand lay pitch are cooperatively selected so that the filament width in the plane of the widest longitudinal cross-section of the conductor is greater than the filament height of the widest longitudinal cross-section of the conductor.

4. A cabled conductor according to claim 1, wherein the cabled conductor has an aspect ratio, width to height of the conductor, greater than or equal to about 3:1.

5. A cabled conductor according to claim 1, wherein the cabled conductor has an aspect ratio, width to height of the conductor, greater than or equal to about 5:1.

6. A cabled conductor according to claim 1, wherein the cabled conductor has a packing factor of at least about 75 percent.

7. A cabled conductor according to claim 1, wherein the cabled conductor has a packing factor of at least about 85 percent.

8. A cabled conductor according to claim 2 wherein the strand lay pitch, filament cross-section and filament twist pitch are cooperatively selected to provide a filament transposition area which is always at least ten times the preferred direction area of a typical grain of the desired anisotropic superconducting compound.

9. A cabled conductor according to claim 8 wherein the strand lay pitch, filament cross-section and filament twist pitch are cooperatively selected to provide a filament transposition area which is always at least thirty times the preferred direction area of a typical grain of the desired anisotropic superconducting compound.

10. A cabled conductor comprising a plurality of strands transposed about the longitudinal axis of the conductor, each strand comprising one or more filaments comprising grains of an anisotropic superconducting compound textured such that the crystallographic c axis alignment of each grain of the superconducting compound is substantially perpendicular to the longitudinal axis of the cabled conductor, independent of the rotational orientation of the strands and filaments in the cabled conductor.

11. A cabled conductor according to claim 10 wherein each strand further comprises a conductive matrix material surrounding or supporting the filaments.

12. A cabled conductor according to claim 10 wherein each strand is insulated.

13. A cabled conductor according to claim 10, wherein each strand has a strand lay pitch and each filament has a filament cross-section and filament twist pitch, and the filament cross-section, filament twist pitch, and strand lay pitch are cooperatively selected so that the filament width in the plane of the widest longitudinal cross-section of the conductor is greater than the filament height of the widest longitudinal cross-section of the conductor.

14. A cabled conductor according to claim 10, wherein the cabled conductor has an aspect ratio, width to height of the conductor, greater than or equal to about 3:1.

15. A cabled conductor according to claim 10, wherein the cabled conductor has an aspect ratio, width to height of the conductor, greater than or equal to about 5:1.

16. A cabled conductor according to claim 10, wherein the cabled conductor has a packing factor of at least about 75 percent.

17. A cabled conductor according to claim 10, wherein the cabled conductor has a packing factor of at least about 85 percent.

18. A cabled conductor according to claim 10 wherein the anisotropic superconducting compound is a superconducting ceramic.

19. A cabled conductor according to claim 18 wherein the superconducting ceramic material comprises a superconducting oxide.

20. A cabled conductor according to claim 19 wherein the superconducting ceramic is micaceous or semi-micaceous.

21. A cabled conductor according to claim 20 wherein the superconducting ceramic is a member of the thallium family of superconducting oxides.

22. A cabled conductor according to claim 20 wherein the superconducting ceramic is a member of the bismuth family of superconducting oxides.

23. A cabled conductor according to claim 22 wherein the filaments are twisted and the filament cross-section, filament twist pitch, and strand lay pitch are cooperatively selected so that at each point on the filament, regardless of how it is twisted, the filament width in the plane of the widest longitudinal cross-section of the conductor is always greater than, and preferably twice as large as the filament height orthogonal to the widest longitudinal cross-section of the conductor.

24. A cabled conductor according to claim 22 wherein the superconducting ceramic is BSCCO 2212.

25. A cabled conductor according to claim 22 wherein the superconducting ceramic is BSCCO 2223.

26. A cabled conductor according to claim 19 wherein the superconducting ceramic is a member of the rare earth family of superconducting oxides.

27. A cabled conductor according to claim 26 wherein the cabled conductor is a Litz cable.

28. A cabled conductor according to claim 27 wherein the cable is a Rutherford cable.

29. A cabled conductor according to claim 27 wherein the cable is a Roebel cable.

30. A cabled conductor according to claim 27 wherein the cable is a braided cable.

31. A cabled conductor according to claim 10 wherein each filament is twisted.

32. A cabled conductor according to claim 31 wherein each strand has a preselected strand lay pitch and each filament has a preselected filament cross-section and filament twist pitch, and the strand lay pitch, filament cross-section and filament twist pitch being cooperatively selected to provide a filament transposition area permitting crystallographic grain alignment in the grain direction at the filament cross-over points.

33. A cabled conductor according to claim 32 wherein the strand lay pitch, filament cross-section and filament twist pitch are cooperatively selected to provide a filament transposition area which is always at least ten times the preferred direction area of a typical grain of the desired anisotropic superconducting compound.

34. A cabled conductor according to claim 33 wherein the strand lay pitch, filament cross-section and filament twist pitch are cooperatively selected to provide a filament transposition area which is always at least thirty times the preferred direction area of a typical grain of the desired anisotropic superconducting compound.

* * * * *